United States Patent
Lee et al.

(10) Patent No.: US 12,032,028 B2
(45) Date of Patent: Jul. 9, 2024

(54) APPARATUS AND METHOD FOR DIAGNOSING STATE OF BATTERY

(71) Applicant: LG ENERGY SOLUTION, LTD., Seoul (KR)

(72) Inventors: Dong-Chun Lee, Daejeon (KR); Seung-Hwan Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 365 days.

(21) Appl. No.: 17/608,901

(22) PCT Filed: Nov. 26, 2020

(86) PCT No.: PCT/KR2020/017006
§ 371 (c)(1),
(2) Date: Nov. 4, 2021

(87) PCT Pub. No.: WO2021/107655
PCT Pub. Date: Jun. 3, 2021

(65) Prior Publication Data
US 2022/0317192 A1    Oct. 6, 2022

(30) Foreign Application Priority Data
Nov. 26, 2019 (KR) .......................... 10-2019-0153699

(51) Int. Cl.
*G01R 31/3828* (2019.01)
*G01R 31/36* (2020.01)
*G01R 31/387* (2019.01)

(52) U.S. Cl.
CPC ..... *G01R 31/3828* (2019.01); *G01R 31/3648* (2013.01); *G01R 31/387* (2019.01)

(58) Field of Classification Search
CPC ............ G01R 31/3828; G01R 31/3648; G01R 31/387

(Continued)

(56) References Cited

U.S. PATENT DOCUMENTS 7,136,762 B2 * 11/2006 Ono .................... G01R 31/3828
702/182
8,860,420 B2 * 10/2014 Rich .................... G01R 31/392
324/426

(Continued)

FOREIGN PATENT DOCUMENTS

| CN | 104054214 A | 9/2014 |
| CN | 104297891 A | 1/2015 |

(Continued)

OTHER PUBLICATIONS

International Search Report for PCT/KR2020/017006 mailed on Mar. 30, 2021.

(Continued)

*Primary Examiner* — Ricky Go
(74) *Attorney, Agent, or Firm* — Birch, Stewart, Kolasch & Birch, LLP

(57) ABSTRACT

An apparatus for diagnosing a state of a battery according to an embodiment of the present disclosure includes: a charging and discharging assembly for charging or discharging a battery module; a measurer for measuring a current of the battery module at every predetermined period during a cycle in which the battery module is charged or discharged; and a controller for receiving a measurement value for the current of the battery module from the measuring unit, estimating a state of charge (SOC) of the battery module during the cycle based on the received measurement value, calculating a change rate of the estimated SOC, and determining whether a defect occurs in the battery module based on a comparison result between the calculated change rate of the SOC and a preset reference change rate.

18 Claims, 5 Drawing Sheets

(58) Field of Classification Search
USPC .......................................................... 702/63
See application file for complete search history.

(56) References Cited

U.S. PATENT DOCUMENTS

| | | |
|---|---|---|
| 2004/0001996 A1 | 1/2004 | Sugimoto |
| 2006/0197503 A1* | 9/2006 | Arai .................. G01R 31/3842 |
| | | 320/132 |
| 2009/0099799 A1 | 4/2009 | Barsoukov et al. |
| 2010/0036628 A1 | 2/2010 | Kang et al. |
| 2011/0012604 A1 | 1/2011 | Tsujiko et al. |
| 2011/0112781 A1* | 5/2011 | Anderson ............ G01R 31/392 |
| | | 702/63 |
| 2012/0158330 A1 | 6/2012 | Araki |
| 2012/0226455 A1 | 9/2012 | Kumashiro et al. |
| 2013/0063080 A1 | 3/2013 | Shiraishi |
| 2013/0185007 A1 | 7/2013 | Imre et al. |
| 2013/0300377 A1 | 11/2013 | Mao et al. |
| 2014/0125345 A1 | 5/2014 | Sejima et al. |
| 2014/0335387 A1 | 11/2014 | Takahashi et al. |
| 2015/0355286 A1 | 12/2015 | Kobayashi et al. |
| 2016/0013669 A1 | 1/2016 | Shiraishi |
| 2017/0234930 A1 | 8/2017 | Lee et al. |
| 2018/0022341 A1 | 1/2018 | Jang |
| 2018/0120385 A1 | 5/2018 | Choi et al. |
| 2018/0136283 A1 | 5/2018 | Song et al. |
| 2018/0372805 A1* | 12/2018 | Fischer ................ G01R 31/396 |
| 2019/0271745 A1 | 9/2019 | Sun |
| 2020/0271727 A1 | 8/2020 | Bae et al. |
| 2021/0190872 A1 | 6/2021 | Sun |

FOREIGN PATENT DOCUMENTS

| | | |
|---|---|---|
| CN | 104502859 A | 4/2015 |
| CN | 105048484 A | 11/2015 |
| CN | 107861070 A | 3/2018 |
| CN | 109870655 A | 6/2019 |
| CN | 110217108 A | 9/2019 |
| CN | 103389469 A | 5/2024 |
| DE | 10 2010 038646 A1 | 2/2012 |
| JP | 4-217826 A | 8/1992 |
| JP | 2006-337155 A | 12/2006 |
| JP | 4561859 B2 | 10/2010 |
| JP | 5315369 B2 | 10/2013 |
| JP | 2014-167457 A | 9/2014 |
| JP | 2015-61505 A | 3/2015 |
| JP | 2016-164512 A | 9/2016 |
| JP | 2016-225306 A | 12/2016 |
| JP | 6647986 B2 | 2/2020 |
| JP | 2018-146372 A | 5/2024 |
| KR | 10-2014-0103753 A | 8/2014 |
| KR | 10-1529046 B1 | 6/2015 |
| KR | 10-1776761 B1 | 9/2017 |
| KR | 10-2018-0047768 A | 5/2018 |
| KR | 10-2018-0055123 A | 5/2018 |
| KR | 10-1897859 B1 | 9/2018 |
| KR | 10-1930646 A | 3/2019 |
| KR | 10-2019-0118535 A | 10/2019 |
| WO | WO 2011/007805 A1 | 1/2011 |

OTHER PUBLICATIONS

Extended European Search Report for European Application No. 20894720.0 issued on Jul. 29, 2022.

* cited by examiner

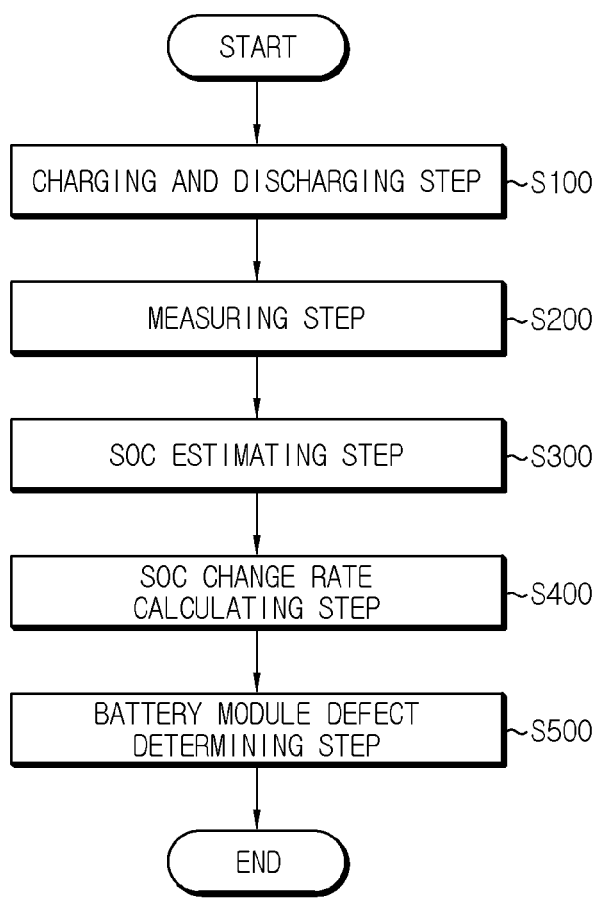

APPARATUS AND METHOD FOR DIAGNOSING STATE OF BATTERY

TECHNICAL FIELD

The present application claims priority to Korean Patent Application No. 10-2019-0153699 filed on Nov. 26, 2019 in the Republic of Korea, the disclosures of which are incorporated herein by reference.

The present disclosure relates to an apparatus and method for diagnosing a state of a battery, and more particularly, to an apparatus and method for diagnosing a state of a battery, which may determine whether a defect occurs in a battery module.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-discharging rate and high energy density.

Meanwhile, if a plurality of batteries are provided in a device, the imbalance of the batteries causes deterioration of the performance of the battery output, so the performance of the devices may be deteriorated. Therefore, in the prior art, in the case where a plurality of batteries are provided, technologies for diagnosing whether a capacity imbalance occurs between the plurality of batteries and solving the problem has been developed.

Patent Literature 1 discloses a technique for diagnosing an imbalance of a plurality of battery banks by calculating an impedance change amount of the plurality of battery banks and analyzing a pattern of the calculated impedance change amount. However, according to Patent Literature 1, in order to calculate the impedance change amount of the battery banks, it is necessary to measure a voltage change amount and a current value of the battery banks. In addition, in order to determine whether or not the battery banks are unbalanced, it is essential to analyze the pattern of the impedance change amount. Accordingly, Patent Literature 1 has a problem in that it is not possible to quickly diagnose an imbalance of the plurality of battery banks.

(Patent Literature 1) KR 10-2014-0103753 A

DISCLOSURE

Technical Problem

The present disclosure is designed to solve the problems of the related art, and therefore the present disclosure is directed to providing an apparatus and method for diagnosing a state of a battery, which quickly and accurately determines whether a defect occurs in a battery module based on a change rate of an SOC of the battery module.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided an apparatus for diagnosing a state of a battery pack, the battery pack having a battery module with at least one battery cell, the apparatus comprising: a charging and discharging assembly configured to charge or discharge the battery module; a measurer configured to measure a current of the battery module at every predetermined period during a cycle in which the battery module is charged or discharged; and a controller configured to receive a measurement value for the current of the battery module from the measuring unit, estimate a state of charge (SOC) of the battery module during the cycle based on the received measurement value, calculate a change rate of the estimated SOC, and determine whether a defect occurs in the battery module based on a comparison result between the calculated change rate of the SOC and a preset reference change rate.

The step of calculating a change rate of the estimated SOC includes calculating an instant change rate of the estimated SOC, and determining whether the defect occurs in the battery module based on a comparison result between the calculated instant change rate and the preset reference change rate corresponding thereto at the same time point.

The battery module includes a plurality of battery cells and in response to the calculated instant change rate being greater than the preset reference change rate, controller may be configured to determine that a defect occurs in at least one of the plurality of battery cells included in the battery module.

The controller may be configured to calculate an instant change rate of the estimated SOC, determine a plurality of peaks in the calculated instant change rate, select a peak closest to an intermediate time point of the cycle among the plurality of determined peaks as a target peak, and determine whether the defect occurs in the battery module by comparing the selected target peak with a reference peak of the preset reference change rate.

The battery module may be provided in plural.

The control unit may be configured to calculate an instant change rate of the SOC for each of the plurality of battery modules, select a target peak in the instant change rate of each of the plurality of battery modules, and determine a relative degree of defect occurrence of the plurality of battery modules by comparing magnitudes of the plurality of selected target peaks.

The plurality of target peaks may be peaks closest to an intermediate time point of a charging and discharging cycle of corresponding battery modules and be locatable at different time points.

The controller may be configured to determine that the degree of defect occurrence of each battery module is greater as a magnitude of the corresponding target peak among the plurality of selected target peaks is greater.

A battery pack according to another aspect of the present disclosure may comprise the apparatus for diagnosing a state of a battery according to an embodiment of the present disclosure.

In another aspect of the present disclosure, there is also provided a method for diagnosing a state of a battery, which diagnoses a state of a battery module having at least one battery cell, the method comprising: a charging and discharging step of charging or discharging the battery module; a measuring step of measuring a current of the battery module at every predetermined period during a cycle in which the battery module is charged or discharged; a SOC estimating step of estimating a state of charge (SOC) of the battery module during the cycle based on the measurement value measured in the measuring step; a SOC change rate calculating step of calculating a change rate of the SOC estimated in the SOC estimating step; and a battery module defect determining step of determining whether a defect occurs in the battery module based on a comparison result between the change rate calculated in the change rate calculating step and a preset reference change rate.

The change rate calculating step may include an instant change rate calculating step of calculating an instant change rate of the SOC for each of the plurality of battery modules.

The defect determining step may include: a target peak selecting step of selecting a target peak in the instant change rate of each of the plurality of battery modules calculated in the change rate calculating step; and a relative defect determining step of determining a relative degree of defect occurrence of the plurality of battery modules by comparing magnitudes of the plurality of selected target peaks.

Advantageous Effects

According to one aspect of the present disclosure, the apparatus for diagnosing a state of a battery has an advantage of accurately diagnosing whether a defect occurs in the battery module just by comparing SOC change rates based on the capacity characteristics of the battery module.

In addition, according to one aspect of the present disclosure, the apparatus for diagnosing a state of a battery has an advantage of quickly diagnosing whether a defect occurs in the battery module by calculating the SOC change rate while the battery module is charged or discharged.

In addition, according to one aspect of the present disclosure, the apparatus for diagnosing a state of a battery has an advantage of determining whether a defect occurs in the battery module using a relatively simple circuit configuration and minimizing the physical space required for the apparatus for diagnosing a state of a battery.

The effects of the present disclosure are not limited to the above, and other effects not mentioned herein will be clearly understood by those skilled in the art from the appended claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

FIG. 8 is a diagram schematically showing a method for diagnosing a state of a battery according to another embodiment of the present disclosure.

BEST MODE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, a preferred embodiment of the present disclosure will be described in detail with reference to the accompanying drawings.

Figure 1:
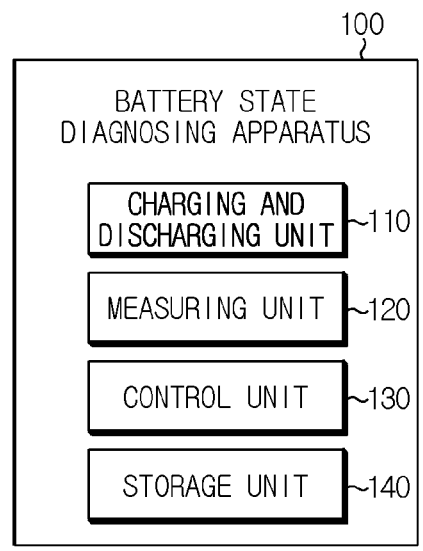
FIG. 1 is a diagram schematically showing an apparatus for diagnosing a state of a battery according to an embodiment of the present disclosure.

FIG. 1 is a diagram schematically showing an apparatus 100 for diagnosing a state of a battery according to an embodiment of the present disclosure.

Referring to FIG. 1, the apparatus 100 for diagnosing a state of a battery according to an embodiment of the present disclosure may include a charging and discharging unit 110, a measuring unit 120, and a control unit 130.

The apparatus 100 for diagnosing a state of a battery according to an embodiment of the present disclosure may diagnose a state of a battery module 10 having at least one battery cell.

Here, the battery module 10 may include at least one battery cell. If the battery module 10 includes a plurality of battery cells, the plurality of battery cells may be connected in series and/or in parallel. Preferably, the plurality of battery cells included in the battery module 10 may be connected in parallel with each other. In addition, the battery cell refers to one independent cell that has a negative electrode terminal and a positive electrode terminal and is physically separable. For example, one pouch-type lithium polymer cell may be regarded as the battery cell.

Figure 2:
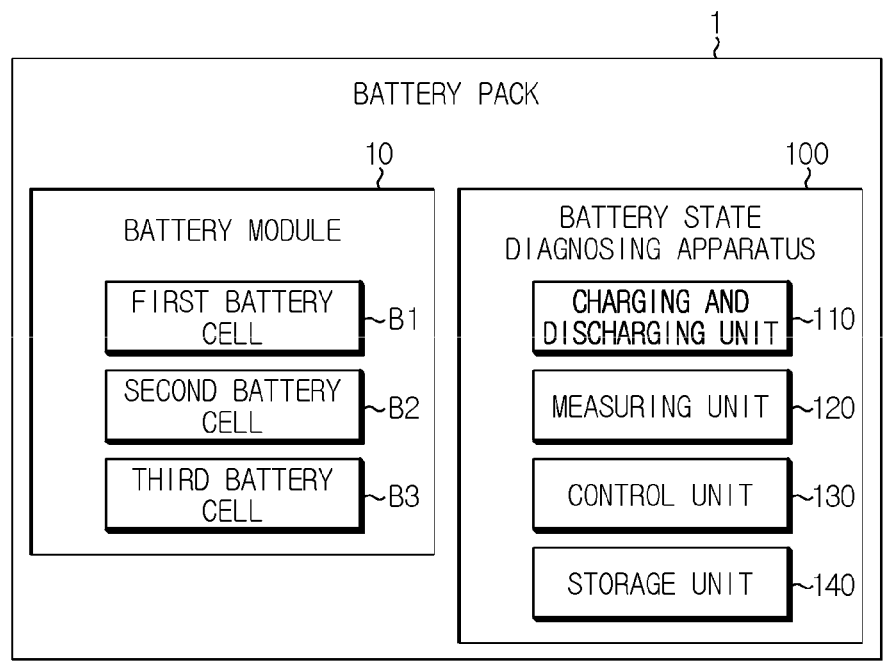
FIG. 2 is a diagram schematically showing a battery pack that includes the apparatus for diagnosing a state of a battery according to an embodiment of the present disclosure.
Figure 3:
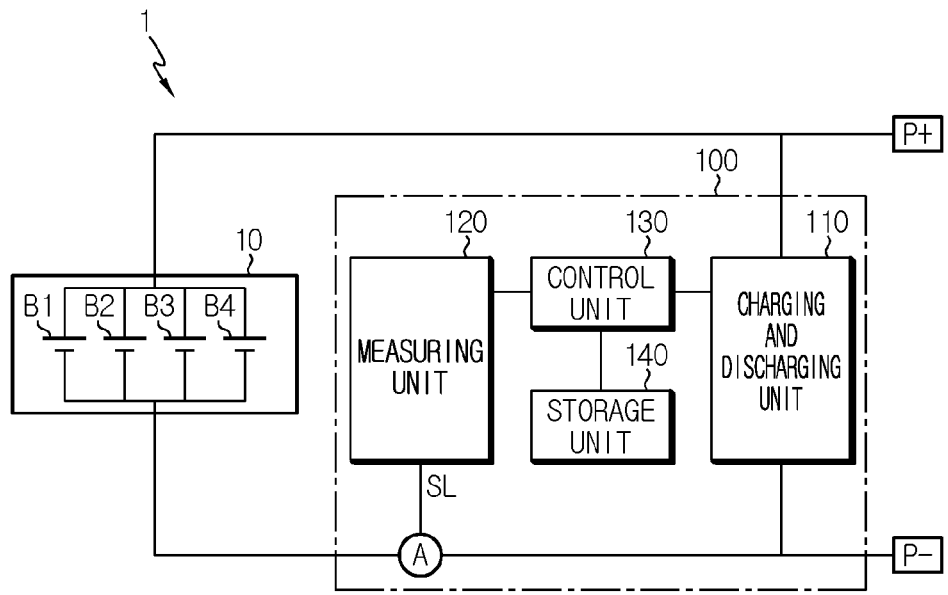
FIG. 3 is a diagram showing an exemplary configuration of the battery pack that includes the apparatus for diagnosing a state of a battery according to an embodiment of the present disclosure.

FIG. 2 is a diagram schematically showing a battery pack 1 that includes the apparatus 100 for diagnosing a state of a battery according to an embodiment of the present disclosure. FIG. 3 is a diagram showing an exemplary configuration of the battery pack 1 that includes the apparatus 100 for diagnosing a state of a battery according to an embodiment of the present disclosure.

Referring to FIGS. 2 and 3, the battery module 10 may be connected to the battery pack 1. That is, the positive electrode of the battery module 10 may be electrically connected to a positive electrode terminal P+ of the battery pack 1. In addition, the negative electrode of the battery module 10 may be electrically connected to a negative electrode terminal P− of the battery pack 1.

For example, in the embodiment of FIG. 3, the battery pack 1 may include one battery module 10, and the battery module 10 may include a first battery cell B1, a second battery cell B2, a third battery cell B3 and a fourth battery cell B4 connected in parallel.

If the apparatus 100 for diagnosing a state of a battery according to an embodiment of the present disclosure is included in the battery pack 1, the apparatus 100 for diagnosing a state of a battery may be connected to the battery module 10 included in the battery pack 1 and a main charging and discharging path of the battery pack 1. Here, the main charging and discharging path is a path that connects the positive electrode terminal P+ of the battery pack 1, the battery module 10 and the negative electrode terminal P− of the battery pack 1, and refers to a high current path through which a current flows in the battery pack 1.

The charging and discharging unit 110 may be configured to charge or discharge the battery module 10.

The charging and discharging unit 110 may be connected to the control unit 130 to receive a charging command signal or a discharging command signal from the control unit 130. In addition, the charging and discharging unit 110 may be operated to correspond to the charging command signal or the discharging command signal received from the control unit 130. Here, the charging command signal is a signal for charging the battery module 10, and the discharging command signal is a signal for discharging the battery module 10.

For example, if the charging and discharging unit 110 receives the charging command signal from the control unit 130, the charging and discharging unit 110 may output a current to the main charging and discharging path. The current output from the charging and discharging unit 110 may flow through the main charging and discharging path to charge the battery module 10. Specifically, the current output from the charging and discharging unit 110 may charge at least one battery cell provided in the battery module 10.

As another example, if the charging and discharging unit 110 receives the discharging command signal from the control unit 130, the charging and discharging unit 110 may be charged by receiving a current from the battery module 10 through the main charging and discharging path.

In the embodiment of FIG. 3, one end of the charging and discharging unit 110 may be connected between the positive electrode terminal P+ of the battery pack 1 and the positive electrode of the battery module 10. In addition, the other end of the charging and discharging unit 110 may be connected between the negative electrode terminal P− of the battery pack 1 and the negative electrode of the battery module 10. Therefore, if the charging and discharging unit 110 receives a charging command signal from the control unit 130, the current output from the charging and discharging unit 110 may flow through the main charging and discharging path to charge the battery module 10.

However, even though the embodiment of FIG. 3 illustrates an example where both ends of the charging and discharging unit 110 are directly connected to the main charging and discharging path, it is also possible that one end of the charging and discharging unit 110 is connected to the positive electrode terminal P+ of the battery pack 1 and the other end of the charging and discharging unit 110 is connected to the negative electrode terminal P− of the battery pack 1, unlike FIG. 3. That is, both ends of the charging and discharging unit 110 may be connected to the electrodes of the battery pack 1 to charge or discharge the battery module 10.

The measuring unit 120 may be configured to measure a current of the battery module 10 at every predetermined period during a cycle in which the battery module 10 is charged or discharged.

For example, in the embodiment of FIG. 3, an ampere meter A and/or a sense resistor for measuring the current of the battery module 10 may be further disposed on the main charging and discharging path. Hereinafter, for convenience of explanation, it will be described that the ampere meter A is disposed on the main charging and discharging path. In addition, the measuring unit 120 may be connected to the ampere meter A through a sensing line SL to measure the current flowing through the main charging and discharging path.

If the sense resistor is disposed on the main charging and discharging path, the measuring unit 120 may calculate a drop voltage dropped by the sense resistor by measuring the voltage at both ends of the sense resistor. In addition, the measuring unit 120 may measure the current flowing through the main charging and discharging path based on a known resistance of the sense resistor and the calculated drop voltage.

The control unit 130 may be configured to receive a measurement value for the current of the battery module 10 from the measuring unit 120.

Specifically, the control unit 130 and the measuring unit 120 may be connected by wire and/or wirelessly. In addition, the measuring unit 120 may convert the measurement value of the measured current of the battery module 10 into a digital signal and output the converted signal to the control unit 130. The control unit 130 may obtain a current value of the battery module 10 by reading the digital signal received from the measuring unit 120.

For example, in the embodiment of FIG. 3, the control unit 130 and the measuring unit 120 may be connected to each other through a wired line. In addition, the measuring unit 120 may convert the measured current value of the battery module 10 into a digital signal, and output the converted digital signal through the wired line.

The control unit 130 may be configured to estimate a SOC (State of charge) of the battery module 10 during the cycle based on the received measurement value.

For example, the control unit 130 may estimate the SOC of the battery module 10 by counting the current value of the battery module 10 measured by the measuring unit 120 during the cycle. That is, the control unit 130 may estimate the SOC of battery module 10 using an ampere counting method.

In addition, the control unit 130 may be configured to calculate a change rate of the estimated SOC.

Here, the change rate of the SOC is a change rate of the SOC of the battery module 10 during the cycle, and may include, for example, a total change rate of the SOC during the cycle or an instant change rate of the SOC calculated at every predetermined period.

For example, it is assumed that a charging cycle during which battery module 10 is charged has progressed from 0 second to 9,000 seconds. The control unit 130 may calculate the change rate of the SOC of battery module 10 while the change rate of the SOC is changed from 0 second to 9,000 seconds. In addition, the control unit 130 may calculate the change rate of the SOC as an instant change rate of the SOC at every predetermined period from 0 second to 9,000 seconds. Here, the predetermined period may be preferably the same as a period during which the measuring unit 120 measures the current of the battery module 10.

The control unit 130 may be configured to determine whether a defect occurs in the battery module 10 based on a comparison result between the calculated change rate of the SOC and a preset reference change rate.

Specifically, the control unit 130 may determine whether a defect occurs in the battery module 10 by comparing the change rate of the SOC calculated for the battery module 10 with the preset reference change rate.

For example, in the embodiment of FIG. 3, it is assumed that both of a reference module Ref and the battery module 10 have four battery cells connected in parallel. It is assumed that the reference module Ref has battery cells in a BOL (Beginning Of Life) state, and the battery module 10 has battery cells in an EOL (End Of Life) state. Since the SOH (State Of Health) of the battery cell is reduced as the battery cell is degraded, the BOL battery cell and the EOL battery cell may have different SOC even though the same amount of current is applied thereto. Therefore, during the same charging cycle, the change rate of the SOC of the reference module Ref and the change rate of the SOC of the battery module 10 may be different. Preferably, the change rate of the SOC of the battery module 10 may be greater than the change rate of the SOC of the reference module Ref during the cycle.

In addition, even when the battery module 10 and the reference module Ref include different numbers of battery cells, the change rate of the SOC of the battery module 10 and the reference change rate may be different from each other. For example, in the embodiment of FIG. 3, it is assumed that four battery cells are normally connected in parallel in the reference module Ref, but the connection of the fourth battery cell among the four battery cells include in the battery module 10 is disconnected. Even in this case, the SOH of the reference module Ref may be greater than the SOH of the battery module 10. Therefore, if the same amount of current is applied to the reference module Ref and the battery module 10, the SOC of the battery module 10 may increase rapidly compared to the SOC of the reference module Ref.

Therefore, the control unit 130 may determine whether a defect occurs in the battery module 10 by comparing the change rate of the SOC of the battery module 10 with the reference change rate. Specifically, the control unit 130 may determine whether the battery module 10 is degraded or whether a connection failure or the like occurs in a battery cell included in the battery module 10.

When determining whether a defect occurs in the battery module 10 having a plurality of battery cells B1, B2 and B3, the apparatus 100 for diagnosing a state of a battery according to an embodiment of the present disclosure may determine whether the battery module 10 has a defect based on the change rate of the SOC of the battery module 10, even though a state of each of the plurality of battery cells B1, B2 and B3 is not individually diagnosed. Therefore, the circuit configuration for determining whether a defect occurs in the battery module 10 is relatively simple, and there is an advantage of minimizing the physical space required for the apparatus 100 for diagnosing a state of a battery.

In addition, since the apparatus 100 for diagnosing a state of a battery determines a defective state of the battery module 10 in consideration of the SOC of the battery module 10 itself, even though the plurality of battery cells B1, B2 and B3 included in the battery module 10 are connected in parallel, there is an advantage in that it is not required to diagnose each battery cell individually, when determining whether a defect occurs in the battery module 10.

Meanwhile, the control unit 130 included in the apparatus 100 for diagnosing a state of a battery may optionally include a processor, an application-specific integrated circuit (ASIC), another chipset, a logic circuit, a register, a communication modem, and a data processing device, and the like, known in the art to execute various control logics disclosed below. In addition, when the control logic is implemented in software, the control unit 130 may be implemented as a set of program modules. At this time, the program module may be stored in a memory and executed by the processor. The memory may be provided in or out of the control unit 130, and may be connected to the control unit 130 by various well-known means.

In addition, referring to FIGS. 1 to 3, the apparatus 100 for diagnosing a state of a battery may further include a storage unit 140. The storage unit 140 may store programs, data and the like required for the control unit 130 to determine whether a defect occurs at the battery module 10 and determine the degree of defect. That is, the storage unit 140 may store data necessary for operation and function of each component of the apparatus 100 for diagnosing a state of a battery, data generated in the process of performing the operation or function, or the like. The storage unit 140 is not particularly limited in its kind as long as it is a known information storage means that can record, erase, update and read data. As an example, the information storage means may include RAM, flash memory, ROM, EEPROM, registers, and the like. In addition, the storage unit 140 may store program codes in which processes executable by the control unit 130 are defined.

Preferably, the control unit 130 may be configured to calculate an instant change rate of the estimated SOC. Hereinafter, an example in which the control unit 130 calculates the instant change rate of the SOC will be described in detail with reference to FIG. 4.

Figure 4:
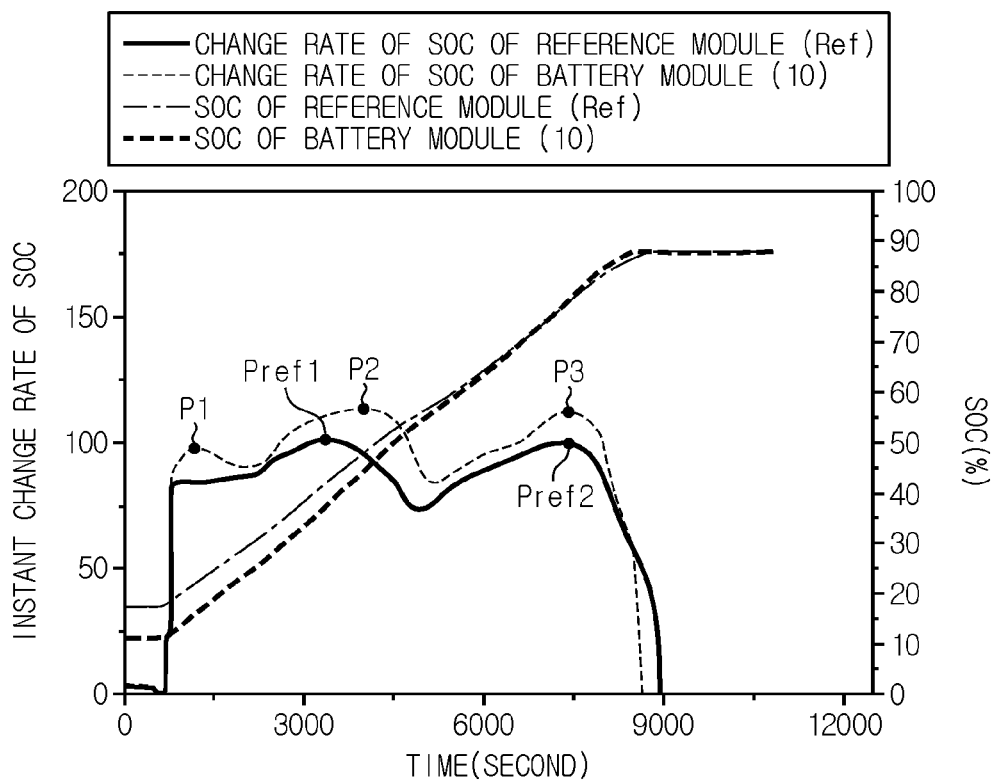
FIG. 4 is a diagram showing a SOC and a SOC change rate of a reference module and a battery module, in the apparatus for diagnosing a state of a battery according to an embodiment of the present disclosure.

FIG. 4 is a diagram showing a SOC and a SOC change rate of a reference module Ref and a battery module 10, in the apparatus 100 for diagnosing a state of a battery according to an embodiment of the present disclosure.

Specifically, FIG. 4 is a diagram showing a SOC estimated by the control unit 130 and a calculated change rate of the SOC during a charging cycle of the reference module Ref and the battery module 10 charged at the same charging C-rate for the same time. More specifically, the battery module 10 is a module including one less battery cell compared to the reference module Ref. In addition, the reference module and the battery module 10 are charged by receiving a charging current of 0.3 C (C-rate) from the charging and discharging unit 110 for the same time.

Referring to FIG. 4, during the same charging time, the SOC of the reference module Ref and the SOC of the battery module 10 are shown. In addition, the instant change rate of the SOC of the reference module Ref and the instant change rate of the SOC of the battery module 10 are shown.

Here, the instant change rate is a change rate obtained by applying a limit to an average change rate of the SOC, and may mean, for example, a slope of a tangent of the SOC shown in FIG. 4.

In an embodiment, the control unit 130 may estimate the SOC of the battery module 10 by counting the current value of the battery module 10 measured by the measuring unit 120 while the battery module 10 is charged or discharged. In addition, the control unit 130 may calculate the instant change rate of the SOC of the battery module 10 simultaneously with estimating the SOC of the battery module 10.

For example, it is assumed that the measuring unit 120 measures the current of the battery module 10 with the period of 100 seconds, and the control unit 130 estimates the SOC of the battery module 10 with the period of 100 seconds. The control unit 130 may calculate the instant change rate of the SOC of the battery module 10 at the time point of 900 seconds while estimating the SOC of the battery module 10 at the time point of 1,000 seconds. That is, since the instant change rate is a limit value of the average change rate (the slope of the tangent of the SOC), the control unit 130 may estimate the SOC of the battery module 10 and calculate the instant change rate of the SOC together to quickly determine a defect.

In another embodiment, the control unit 130 may store the SOC in the storage unit 140 whenever estimating the SOC of the battery module 10. That is, in the charging cycle of the battery module 10, the storage unit 140 may store a plurality of SOCs estimated at every predetermined period. In addition, the control unit 130 may calculate an instant change rate of the SOC corresponding to the predetermined period with respect to the plurality of SOCs stored in the storage unit 140.

In addition, the control unit 130 may be configured to determine whether a defect occurs in the battery module 10 by comparing the calculated instant change rate and a reference change rate corresponding thereto at the same time point.

Here, the reference change rate may be an instant change rate of the SOC of the reference module Ref. The reference change rate may be stored in the storage unit 140 in advance.

The control unit 130 may determine whether a defect occurs in the battery module 10 by comparing the magnitudes of the instant change rates for the battery module 10 and the reference module Ref at the same time point.

For example, in the embodiment of FIG. 4, the control unit 130 may calculate the change rate of the SOC of the battery module 10, and then compare the change rate of the SOC of the battery module 10 and the change rate of the SOC of the reference module Ref at one or more time points during the charging cycle.

Preferably, the control unit 130 may select at least one time point after a predetermined time passes from the time point at which the cycle starts.

For example, the control unit 130 may select a time point at which 1,500 seconds passes from a time point (0 second) at which the cycle starts. In addition, the control unit 130 may determine whether a defect occurs in the battery module 10 by comparing the change rate of the SOC of the reference module Ref and the change rate of the SOC of the battery module 10 at the selected time point (1,500 seconds).

As another example, the control unit 130 may select all time points at which 1,500 seconds, 3,000 seconds, 4,500 seconds, 6,000 seconds and 7,500 seconds pass from the time point (0 second) at which the cycle starts. In addition, the control unit 130 may determine whether a defect occurs in the battery module 10 by comparing the change rate of the SOC of the reference module Ref and the change rate of the SOC of the battery module 10 at the plurality of selected time points (1,500 seconds, 3,000 seconds, 4,500 seconds, 6,000 seconds and 7,500 seconds). That is, if the control unit 130 determines whether a defect occurs in the battery module 10 based only on the change rate of the SOC at any one time point, it may be erroneously determined whether a defect occurs in the battery module 10 due to a measurement error of the measuring unit 120 or a SOC estimation error of the control unit 130. Accordingly, the control unit 130 may more accurately determine whether a defect occurs in the battery module 10 by selecting a plurality of time points and comparing the change rate of the SOC at the plurality of selected time points.

The apparatus 100 for diagnosing a state of a battery according to an embodiment of the present disclosure has an advantage of accurately and quickly diagnosing whether a defect occurs in the battery module 10 just by comparing the instant change rate of the SOC based on the capacity characteristics of the battery module 10 having battery cells.

The control unit 130 may be configured to determine that a defect occurs in at least one of the plurality of battery cells B1, B2 and B3 included in the battery module 10, if the calculated instant change rate is greater than the reference change rate.

That is, as described above, if a defect occurs in at least one of the plurality of battery cells B1, B2 and B3 included in the battery module 10, the SOH of the battery module 10 may be reduced. This means that even if the same amount of current is applied, the SOC of the battery module 10 with a reduced SOH may increase rapidly compared to the reference module Ref.

Therefore, if the calculated instant change rate is greater than the reference change rate, the control unit 130 may determine that a defect occurs in the battery module 10.

Conversely, if the calculated instant change rate is less than the reference change rate, the control unit 130 may be configured to determine that a defect does not occur in all of the plurality of battery cells B1, B2 and B3 included in the battery module 10.

For example, in the embodiment of FIG. 4, the battery module 10 is a module having one less battery cell compared to the reference module Ref. Accordingly, as shown in FIG. 4, the instant change rate of the SOC of the battery module 10 may be greater than the instant change rate of the SOC of the reference module Ref. Accordingly, the control unit 130 may determine that a defect occurs in the battery module 10 according to the comparison result of the instant change rate of the SOC between the battery module 10 and the reference module Ref.

The control unit 130 may be configured to determine a plurality of peaks at the calculated instant change rate.

Specifically, the control unit 130 may determine a point at which the change rate increases and then decreases in the change rate of the SOC of the reference module Ref and the calculated change rate of the SOC of the battery module 10 as the peak.

For example, in the embodiment of FIG. 4, the control unit 130 may determine P1, P2 and P3 as peaks in the change rate of the SOC of the battery module 10, and determine Pref1 and Pref2 as peaks in the change rate of the SOC of the reference module Ref.

In addition, the control unit 130 may be configured to select a peak closest to an intermediate time point of the charging and discharging cycle among the plurality of determined peaks as a target peak.

For example, in the embodiment of FIG. 4, the control unit 130 may select P2 as a target peak for the battery module 10 and select Pref1 as a target peak for the reference module Ref.

Specifically, the battery cell has a characteristic that a chemical action occurs therein during the charging or discharging process, and according to this characteristic, the SOC of the battery cell may be affected by the change of the internal resistance of the battery cell. That is, the SOC of the battery cell has a one-to-one relationship with an OCV (Open Circuit Voltage) of the battery cell, and the OCV of the battery cell is inversely proportional to the internal resistance of the battery cell. Therefore, in order to determine whether a defect occurs in the battery module 10 based on the SOC change rate of the battery module 10, the control unit 130 may select a peak that responds most sensitively to the change of the internal resistance of the battery cell as a target peak among the plurality of selected peaks. In addition, the target peak may be a peak closest to the intermediate time point of the charging and discharging cycle.

That is, since the target peak selected by the control unit 130 is a peak most sensitive to the change of the resistance of the battery cell, considering the characteristics of the battery cell as described above, the target peak is a peak that may be used for most accurate comparison to determine whether a defect occurs in the battery cell based on the change rate of the SOC. Therefore, in order to determine whether a defect occurs in the battery module 10 by comparison between the change rate of the SOC of the battery module 10 and the reference change rate, the control unit 130 may select a peak closest to the intermediate time point of the charging and discharging cycle as a target peak.

The control unit 130 may be configured to determine whether a defect occurs in the battery module 10 by comparing the selected target peak with a reference peak of the reference change rate.

For example, in the embodiment of FIG. 4, the control unit 130 may determine whether a defect occurs in the battery module 10 by comparing the magnitudes of P2 and Pref1. Referring to FIG. 4, since P2 is greater than Pref1, the control unit 130 may determine that a defect occurs in the battery module 10.

The apparatus 100 for diagnosing a state of a battery according to an embodiment of the present disclosure may diagnose whether a defect occurs in the battery module 10 more accurately with high reliability by comparing the magnitude of the selected target peak in consideration of the characteristics of the battery cell.

In addition, since the apparatus 100 for diagnosing a state of a battery may determine whether a defect occurs in the battery module 10 by not only comparing the change rate of the SOC of battery module 10 and the reference change rate at the same time point but also comparing the magnitude of the target peak, there is an advantage that it may be determined whether a defect occurs in the battery module 10 in various aspects.

Figure 5:
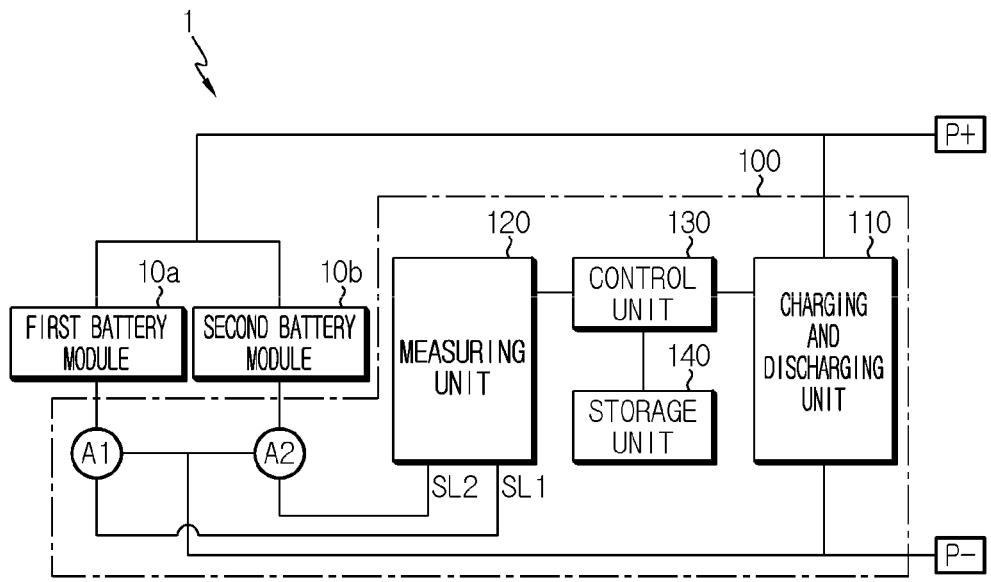
FIG. 5 is a diagram showing an exemplary configuration of another battery pack that includes the apparatus for diagnosing a state of a battery according to an embodiment of the present disclosure.

FIG. 5 is a diagram showing an exemplary configuration of another battery pack 1 that includes the apparatus 100 for diagnosing a state of a battery according to an embodiment of the present disclosure.

Referring to FIG. 5, the battery pack 1 may include a plurality of the battery modules 10.

For example, as shown in FIG. 5, a first battery module 10a and a second battery module 10b may be included in the battery pack 1. Here, the first battery module 10a and the second battery module 10b may be connected in parallel with each other.

In addition, a first ampere meter A1 for measuring a current of the first battery module 10a may be disposed at one end of the first battery module 10a. In addition, a second ampere meter A2 for measuring a current of the second battery module 10b may be disposed at one end of the second battery module 10b.

In addition, the measuring unit 120 may be connected to the first ampere meter A1 through a first sensing line SL1 to measure the current of the first battery module 10a. Also, the measuring unit 120 may be connected to the second ampere meter A2 through a second sensing line SL2 to measure the current of the second battery module 10b.

The control unit 130 may be configured to calculate an instant change rate of the SOC for each of the plurality of battery modules 10a, 10b.

For example, in the embodiment of FIG. 5, the control unit 130 may estimate a SOC of the first battery module 10a based on the current value of the first battery module 10a measured by the measuring unit 120. In addition, the control unit 130 may calculate an instant change rate of the SOC of the first battery module 10a based on the estimated SOC of the first battery module 10a.

In addition, the control unit 130 may estimate a SOC of the second battery module 10b based on the current value of the second battery module 10b measured by the measuring unit 120. In addition, the control unit 130 may calculate an instant change rate of the SOC of the second battery module 10b based on the estimated SOC of the second battery module 10b.

Figure 6:
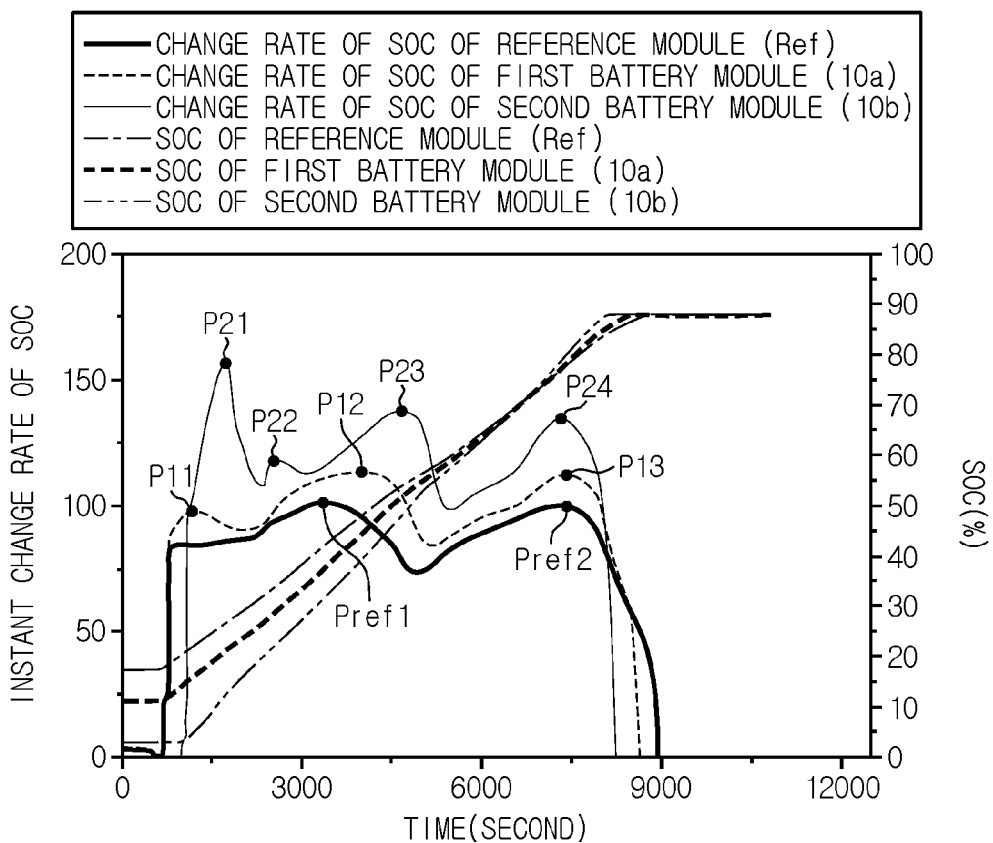
FIG. 6 is a diagram showing a SOC and a SOC change rate of a reference module, a first battery module and a second battery module, in the apparatus for diagnosing a state of a battery according to an embodiment of the present disclosure.
Figure 7:
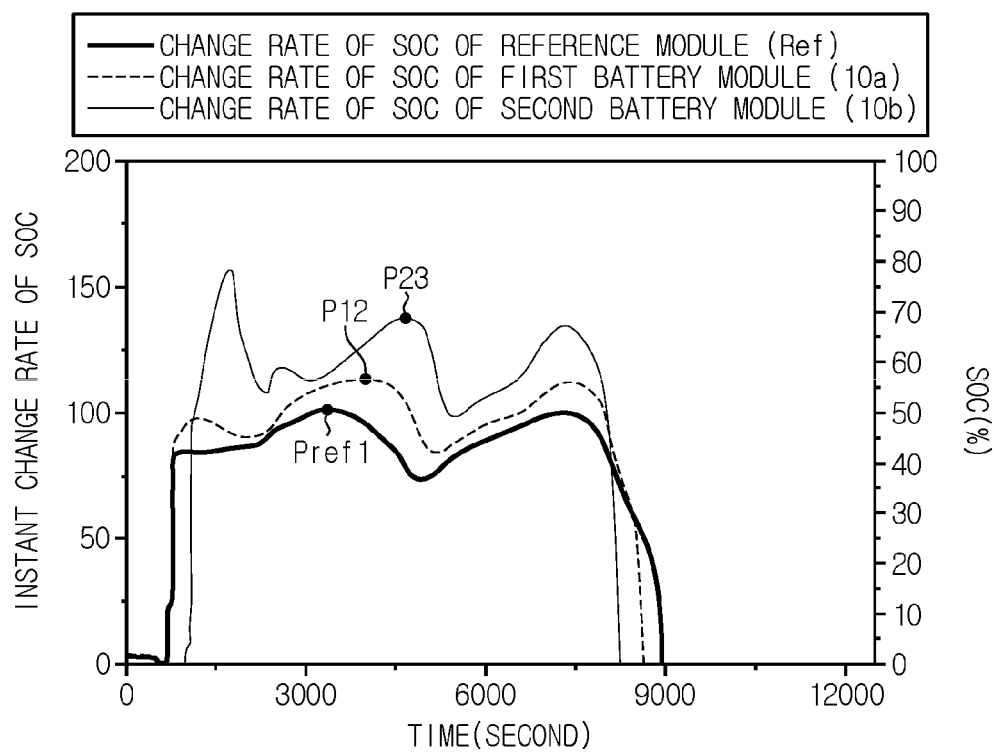
FIG. 7 is a diagram showing a target peak selected for each of a plurality of battery modules in FIG. 6.

FIG. 6 is a diagram showing a SOC and a SOC change rate of a reference module Ref, a first battery module 10a and a second battery module 10b, in the apparatus 100 for diagnosing a state of a battery according to an embodiment of the present disclosure. FIG. 7 is a diagram showing a target peak selected for each of a plurality of battery modules 10a, 10b in FIG. 6.

Specifically, the first battery module 10a is a module having one less battery cell compared to the reference module Ref, and the second battery module 10b is a module having two less battery cells compared to the reference module Ref. In addition, the reference module, the first battery module 10a and the second battery module 10b are charged by receiving a charging current of 0.3 C (C-rate) from the charging and discharging unit 110 for the same time.

Referring to FIG. 6, the control unit 130 may estimate the SOC of the reference module Ref, the first battery module 10a and the second battery module 10b at the same time point, and calculate the instant change rate of the SOC. Here, the instant change rate of the SOC of the reference module Ref may be a reference change rate. In addition, the SOC of the reference module Ref and the instant change rate of the SOC may be stored in the storage unit 140 in advance. In this case, the control unit 130 may obtain the SOC of the reference module Ref and the instant change rate of the SOC by referring to the storage unit 140.

In addition, the control unit 130 may be configured to select a target peak in the instant change rate of each of the plurality of battery modules 10a, 10b.

First, the control unit 130 may determine a plurality of peaks in each of the instant change rates of the reference module Ref and the plurality of battery modules 10a, 10b.

For example, in the embodiment of FIG. 6, the control unit 130 may determine Pref1 and Pref2 as peaks in the instant change rate of the SOC of the reference module Ref In addition, the control unit 130 may determine P11, P12 and P13 as peaks in the instant change rate of the SOC of the first battery module 10a. Finally, the control unit 130 may determine P21, P22, P23 and P24 as peaks in the instant change rate of the SOC of the second battery module 10b.

In addition, the control unit 130 may select a target peak for each of the reference module Ref, the first battery module 10a and the second battery module 10b among the plurality of determined peaks.

As described above, the target peak may be selected as a peak closest to the intermediate time point of the cycle.

For example, in the embodiment of FIG. 6, the control unit 130 may select Pref1 as a target peak for the reference module Ref, select P12 as a target peak for the first battery cell B1, and select P23 as a target peak for the second battery cell B2. The target peaks selected by the control unit 130 for the reference module Ref, the first battery module 10a and the second battery module 10b are as shown in FIG. 7.

In addition, the control unit 130 may be configured to determine a relative degree of defect occurrence of the plurality of battery modules 10a, 10b by comparing the magnitudes of the plurality of selected target peaks.

Specifically, the control unit 130 may compare the magnitudes of the plurality of target peaks, and determine that the degree of defect occurrence of the corresponding battery module 10 is relatively greater than that of other battery modules 10 as the magnitude of the corresponding target peak is greater.

For example, in the embodiment of FIG. 7, the control unit 130 may compare the magnitudes of Pref1, P12 and P23. It is assumed that the magnitude of Pref1 is about 100, the magnitude of P12 is about 112, and the magnitude of P23 is about 137. Since the magnitude of P23 is greater than the magnitudes of Pref1 and P12, the control unit 130 may determine that the degree of defect occurrence of the second battery module 10b is greater than that of the first battery module 10a and the reference module Ref. In addition, since the magnitude of P12 is greater than the magnitude of Pref1, the control unit 130 may determine that the degree of defect occurrence of the first battery module 10a is greater than that of the reference module Ref.

In the above, the control unit 130 determines the relative degree of defect occurrence among the reference module Ref, the first battery module 10a and the second battery module 10b by comparing the magnitudes of the target peaks among the reference module Ref, the first battery module 10a and the second battery module 10b. However, the control unit 130 may determine the relative degree of defect occurrence just between the plurality of battery modules 10a, 10b included in the battery pack 1, excluding the reference module Ref.

The apparatus 100 for diagnosing a state of a battery according to an embodiment of the present disclosure has an advantage of quickly and easily determining the relative degree of defect occurrence between the plurality of battery modules 10a, 10b by comparing the target peaks sensitive to the resistance change of the battery module 10, even if there is no process of estimating the internal resistance or SOH of each of the plurality of battery modules 10a, 10b.

That is, the apparatus 100 for diagnosing a state of a battery has an advantage of quickly determining the relative degree of defect occurrence between the plurality of battery modules 10a, 10b based on the SOC change rate that may be calculated during one charging process of the plurality of battery modules 10a, 10b.

The plurality of target peaks are peaks closest to the intermediate time point of the charging and discharging cycle of the corresponding battery module 10, and may be located at different time points.

For example, in the embodiment of FIG. 7, the target peak for the reference module Ref is Pref1, the target peak for the first battery module 10a is P12, and the target peak for the second battery module 10b is P23. That is, since the target peak is a peak most sensitive to the change of resistance of the battery module 10, the time points at which the peaks appear may be different.

However, even if the degrees of defect of the plurality of battery modules 10a, 10b are different from each other, the target peaks of the plurality of battery modules 10a, 10b may be peaks closest to the intermediate time point of the charging cycle or the discharging cycle.

Therefore, the apparatus 100 for diagnosing a state of a battery according to an embodiment of the present disclosure has an advantage of easily selecting a target peak at the change rate of the SOC in consideration of the above characteristics of the target peak. In other words, the apparatus 100 for diagnosing a state of a battery has an advantage of easily and quickly selecting a target peak by using only the SOC change rate, even if the voltage-charging amount curve (Q-dV/dQ curve) for the battery module 10 is not obtained. As a result, since the target peak may be selected quickly, the degree of defect occurrence between the plurality of battery modules 10a, 10b may be quickly and accurately compared.

The apparatus 100 for diagnosing a state of a battery according to the present disclosure may be applied to a BMS (Battery Management System). That is, the BMS according to the present disclosure may include the apparatus 100 for diagnosing a state of a battery described above. In this configuration, at least some of the components of the apparatus 100 for diagnosing a state of a battery may be implemented by supplementing or adding functions of components included in a conventional BMS. For example, the charging and discharging unit 110, the measuring unit 120, the control unit 130 and the storage unit 140 of the apparatus 100 for diagnosing a state of a battery may be implemented as components of the BMS.

In addition, the apparatus 100 for diagnosing a state of a battery according to the present disclosure may be provided to a battery pack 1. For example, referring to FIGS. 2 and 3, the battery pack 1 may include the apparatus 100 for diagnosing a state of a battery according to an embodiment of the present disclosure, and the battery module 10 having at least one battery cell. In addition, the battery pack 1 may further include electrical equipment (a relay, a fuse, etc.), a case, and the like.

FIG. 8 is a diagram schematically showing a method for diagnosing a state of a battery according to another embodiment of the present disclosure.

The method for diagnosing a state of a battery according to another embodiment of the present disclosure is a method for diagnosing a state of the battery module 10 having at least one battery cell, and may be performed by the apparatus 100 for diagnosing a state of a battery.

Referring to FIG. 8, the method for diagnosing a state of a battery according to another embodiment of the present disclosure may include a charging and discharging step (S100), a measuring step (S200), a SOC estimating step (S300), a SOC change rate calculating step (S400) and a battery module defect determining step (S500).

The charging and discharging step (S100) is a step of charging or discharging the battery module 10, and may be performed by the charging and discharging unit 110.

For example, the charging and discharging unit 110 may receive a charging command signal or a discharging command signal from the control unit 130. If receiving the charging command signal, the charging and discharging unit 110 may output a current to the main charging and discharging path of the battery pack 1 to charge the battery module 10. Conversely, when receiving the discharging command signal, the charging and discharging unit 110 may be charged by receiving a current from the battery module 10.

The measuring step (S200) is a step of measuring the current of the battery module 10 at every predetermined period during a cycle in which the battery module 10 is charged or discharged, and may be performed by the measuring unit 120.

For example, in the embodiment of FIG. 3, the measuring unit 120 may measure the current of the battery module 10 using the ampere meter A connected through the sensing line SL while the battery module 10 is charged.

The SOC estimating step (S300) is a step of estimating the SOC of the battery module 10 during the cycle based on the measurement value measured in the measuring step (S200), and may be performed by the control unit 130.

For example, the control unit 130 may estimate the SOC of the battery module 10 at every predetermined period in which the measuring unit 120 measures the current of the battery module 10. For example, if the measuring unit 120 measures the current of the battery module 10 at every 100 seconds, the control unit 130 may estimate the SOC of the battery module 10 at every 100 seconds when the measuring unit 120 measures the current of the battery module 10. Here, the control unit 130 may estimate the SOC of the battery module 10 by accumulatively counting the current values measured by the measuring unit 120.

The SOC change rate calculating step (S400) is a step of calculating the change rate of the SOC estimated in the SOC estimating step (S300), and may be performed by the control unit 130.

The control unit 130 may calculate the change rate of the SOC of the battery module 10 estimated during the cycle. Preferably, the control unit 130 may calculate the change rate of the SOC of the battery module 10 at every predetermined period.

For example, as in the former embodiment, the control unit 130 may estimate the SOC of the battery module 10 at every 100 seconds, and calculate the change rate of the SOC of the battery module 10 at every 100 seconds.

The battery module defect determining step (S500) is a step of determining whether a defect occurs in the battery module 10 based on the comparison result between the change rate calculated in the SOC change rate calculating step (S400) and a preset reference change rate, and may be performed by the control unit 130.

That is, the control unit 130 may quickly and accurately determine whether a defect occurs in the battery module 10 by comparing the magnitudes of the calculated change rate and the reference change rate. Preferably, the control unit 130 may determine whether a defect occurs in the battery module 10 by comparing the magnitudes of the change rate calculated at the same time point and the reference change rate.

As in the embodiment of FIG. 6, the battery module 10 may be provided in plural.

In this case, the SOC change rate calculating step (S400) may include an instant SOC change rate calculating step (S400).

The instant SOC change rate calculating step (S400) is a step of calculating an instant change rate of the SOC for each of the plurality of battery modules 10a, 10b, and may be performed by the control unit 130.

That is, the control unit 130 may estimate the SOC of each of the plurality of battery modules 10a, 10b, and calculate an instant change rate of the SOC for each of the plurality of battery modules 10a, 10b.

In order to more quickly calculate the change rate of the SOC, the control unit 130 may calculate the change rate of the SOC of a previous period simultaneously with estimating the SOC of the battery module 10 at the current time point.

In addition, the battery module defect determining step (S500) may further include a target peak selecting step and a relative battery module defect determining step (S500).

The target peak selecting step is a step of selecting a target peak in the instant change rate of each of the plurality of battery modules 10a, 10b calculated in the SOC change rate calculating step (S400), and may be performed by the control unit 130.

For example, as shown in FIG. 6, the control unit 130 may determine a plurality of peaks for each of the plurality of battery modules 10a, 10b. Here, the peak may be a point at which the SOC change rate increases and then decreases. In addition, as shown in FIG. 7, the control unit 130 may select a target peak among the plurality of determined peaks.

The relative battery module defect determining step (S500) is a step of determining a relative degree of defect occurrence of the plurality of battery modules 10a, 10b by comparing the magnitudes of the plurality of selected target peaks, and may be performed by the control unit 130.

That is, the control unit 130 may quickly determine the relative degree of defect occurrence of the plurality of battery modules 10a, 10b by comparing the magnitudes of the target peaks.

The embodiments of the present disclosure described above are not necessarily implemented by an apparatus and method but may also be implemented through a program for realizing functions corresponding to the configuration of the present disclosure or a recording medium on which the program is recorded. Such implementation may be easily performed by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
10: battery module
10a: first battery module
10b: second battery module
100: apparatus for diagnosing a state of a battery
110: charging and discharging unit
120: measuring unit
130: control unit
140: storage unit
Ref: reference module

What is claimed is:

1. An apparatus for diagnosing a state of a battery pack, the battery pack having a battery module with at least one battery cell, the apparatus comprising:
a charging and discharging assembly configured to charge or discharge the battery module;
a measurer configured to measure a current of the battery module at every predetermined period during a cycle in which the battery module is charged or discharged; and
a controller configured to:
receive a measurement value for the current of the battery module from the measurer, estimate a state of charge (SOC) of the battery module during the cycle based on the received measurement value,
calculate a change rate of the estimated SOC, and
determine whether a defect occurs in the battery module based on a comparison result between the calculated change rate of the SOC and a preset reference change rate,
wherein the controller is configured to calculate an instant change rate of the estimated SOC, determine a plurality of peaks in the calculated instant change rate, select a peak closest to an intermediate time point of the cycle among the plurality of determined peaks as a target peak, and determine whether the defect occurs in the battery module by comparing the selected target peak with a reference peak of the preset reference change rate.

2. The apparatus for diagnosing a state of a battery according to claim 1,
wherein the step of calculating a change rate of the estimated SOC includes calculating the instant change rate of the estimated SOC, and
wherein the step of determining whether the defect occurs in the battery modules includes determining whether the defect occurs in the battery module based on a comparison result between the calculated instant change rate and the preset reference change rate corresponding thereto at the same time point.

3. The apparatus for diagnosing a state of a battery according to claim 2,
wherein the battery module includes a plurality of battery cells, and
wherein, in response to the calculated instant change rate being greater than the preset reference change rate, the controller determines that the defect occurs in at least one of the plurality of battery cells included in the battery module.

4. The apparatus for diagnosing a state of a battery according to claim 1,
wherein the battery module is provided in plural, and
wherein the controller is configured to:
calculate the instant change rate of the SOC for each of the plurality of battery modules,
select a target peak in the instant change rate of each of the plurality of battery modules, and
determine a relative degree of defect occurrence of the plurality of battery modules by comparing magnitudes of the plurality of selected target peaks.

5. The apparatus for diagnosing a state of a battery according to claim 4,
wherein the plurality of target peaks are peaks closest to an intermediate time point of a charging and discharging cycle of corresponding battery modules and are locatable at different time points.

6. The apparatus for diagnosing a state of a battery according to claim 4,
wherein the controller is configured to determine that the degree of defect occurrence of each battery module is greater as a magnitude of the corresponding target peak among the plurality of selected target peaks is greater.

7. A battery pack, comprising the apparatus for diagnosing a state of a battery according to claim 1.

8. The apparatus for diagnosing a state of a battery according to claim 1, wherein the SOC of the battery module is estimated using an ampere counting method.

9. The apparatus for diagnosing a state of a battery according to claim 1, wherein the battery module includes a plurality of battery cells, and
wherein the current is measured for the battery module as a whole.

10. The apparatus for diagnosing a state of a battery according to claim 1, wherein each peak is a point at which the calculated instant change rate increases and then decreases over a time period.

11. The apparatus for diagnosing a state of a battery according to claim 1, wherein the controller is configured to determine that the defect occurs in the battery module when the selected target peak is greater than the reference peak.

12. A method for diagnosing a state of a battery pack, the battery pack having a battery module with at least one battery cell, the method comprising:
a charging and discharging step of charging or discharging the battery module;
a measuring step of measuring a current of the battery module at every predetermined period during a cycle in which the battery module is charged or discharged;
a state of charge (SOC) estimating step of estimating a SOC of the battery module during the cycle based on the measurement value measured in the measuring step;
a SOC change rate calculating step of calculating a change rate of the SOC estimated in the SOC estimating step; and
a battery module defect determining step of determining whether a defect occurs in the battery module based on a comparison result between the change rate calculated in the change rate calculating step and a preset reference change rate,
wherein the battery module defect determining step further includes:

calculating an instant change rate of the estimated SOC, determining a plurality of peaks in the calculated instant change rate, selecting a peak closest to an intermediate time point of the cycle among the plurality of determined peaks as a target peak, and determining whether the defect occurs in the battery module by comparing the selected target peak with a reference peak of the preset reference change rate.

13. The method for diagnosing a state of a battery according to claim 12, wherein the battery module is provided in plural, wherein the SOC change rate calculating step includes:

an instant change rate calculating step of calculating an instant change rate of the SOC for each of the plurality of battery modules, wherein the battery module defect determining step includes:

a target peak selecting step of selecting the target peak in the instant change rate of each of the plurality of battery modules calculated in the change rate calculating step; and a relative defect determining step of determining a relative degree of defect occurrence of the plurality of battery modules by comparing magnitudes of the plurality of selected target peaks.

14. The method for diagnosing a state of a battery according to claim 13, wherein the battery module defect determining step includes determining that a degree of defect occurrence of each battery module is greater as a magnitude of the corresponding target peak among the plurality of selected target peaks is greater.

15. The method for diagnosing a state of a battery according to claim 12, wherein the SOC of the battery module is estimated using an ampere counting method.

16. The method for diagnosing a state of a battery according to claim 12, wherein the battery module includes a plurality of battery cells, and wherein the current is measured for the battery module as a whole.

17. The method for diagnosing a state of a battery according to claim 12, wherein each peak is a point at which the calculated instant change rate increases and then decreases over a time period.

18. The method for diagnosing a state of a battery according to claim 12, wherein the battery module defect determining step further includes determining that the defect occurs in the battery module when the selected target peak is greater than the reference peak.

* * * * *